US010332968B2

(12) United States Patent
Fujita et al.

(10) Patent No.: US 10,332,968 B2
(45) Date of Patent: Jun. 25, 2019

(54) SEMICONDUCTOR DEVICE AND METHOD FOR MANUFACTURING THE SAME

(71) Applicant: SHARP KABUSHIKI KAISHA, Sakai, Osaka (JP)

(72) Inventors: Tetsuo Fujita, Sakai (JP); Hajime Imai, Sakai (JP); Hisao Ochi, Sakai (JP); Tetsuo Kikuchi, Sakai (JP); Hideki Kitagawa, Sakai (JP); Masahiko Suzuki, Sakai (JP); Shingo Kawashima, Sakai (JP); Tohru Daitoh, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/740,767

(22) PCT Filed: Jun. 21, 2016

(86) PCT No.: PCT/JP2016/068406
§ 371 (c)(1),
(2) Date: Dec. 28, 2017

(87) PCT Pub. No.: WO2017/002672
PCT Pub. Date: Jan. 5, 2017

(65) Prior Publication Data
US 2018/0197959 A1 Jul. 12, 2018

(30) Foreign Application Priority Data

Jun. 29, 2015 (JP) ................. 2015-130053

(51) Int. Cl.
| | | |
|---|---|---|
| H01L 23/62 | (2006.01) |
| H01L 29/417 | (2006.01) |
| H01L 21/28 | (2006.01) |
| H01L 29/786 | (2006.01) |
| H01L 29/45 | (2006.01) |

(Continued)

(52) U.S. Cl.
CPC ........ H01L 29/41725 (2013.01); H01L 21/28 (2013.01); H01L 29/45 (2013.01);
(Continued)

(58) Field of Classification Search
USPC ..... 257/E29.273, E33.053, E29.296, 24, 57, 257/79, 98; 438/151, 384, 30, 48, 128,
(Continued)

(56) References Cited

U.S. PATENT DOCUMENTS

| 2010/0099216 A1 | 4/2010 | Suzawa et al. |
| 2014/0034947 A1 | 2/2014 | Moriguchi et al. |

(Continued)

FOREIGN PATENT DOCUMENTS

| JP | 2010-123923 A1 | 6/2010 |
| JP | 2011-209539 | * 10/2011 |

(Continued)

*Primary Examiner* — Niki H Nguyen
(74) *Attorney, Agent, or Firm* — ScienBiziP, P.C.

(57) ABSTRACT

A semiconductor device (100) is provided with a thin film transistor including an oxide semiconductor layer (5), a gate electrode (3), a gate insulating layer (4), and a source electrode (7s) and a drain electrode (7d) that are in contact with the oxide semiconductor layer, at least one electrode of the source electrode (7s), the drain electrode (7d), and the gate electrode (3) has a multilayer structure that includes a first layer (3A, 7A) containing copper and a second layer (3B, 7B) containing titanium or molybdenum, the thickness of the first layer (3A, 7A) is more than the thickness of the second layer (3B, 7B), when the source electrode (7s) or the drain electrode (7d) has the multilayer structure, the second layer is arranged on the oxide semiconductor layer side of the first layer so as to be in contact with the surface of the oxide semiconductor layer (5), when the gate electrode (3) has the multilayer structure, the second layer is arranged on
(Continued)

the substrate (1) side of the first layer, and the thickness of the second layer is 15 nm or more and 25 nm or less.

6 Claims, 10 Drawing Sheets

(51) Int. Cl.
   *H01L 29/66* (2006.01)
(52) U.S. Cl.
   CPC ...... *H01L 29/66969* (2013.01); *H01L 29/786* (2013.01); *H01L 29/7869* (2013.01)
(58) Field of Classification Search
   USPC ................................. 438/149, 157, 161, 283
   See application file for complete search history.

(56) References Cited

U.S. PATENT DOCUMENTS

| 2014/0091306 A1* | 4/2014 | Miki | ...................... H01L 29/458 |
| | | | 257/59 |
| 2015/0115264 A1* | 4/2015 | Kato | ....................... H01L 29/45 |
| | | | 257/43 |

FOREIGN PATENT DOCUMENTS

| JP | 2011-209539 A | 10/2011 |
| JP | 2012-243779 A | 12/2012 |
| JP | 2014-032999 A | 2/2014 |
| WO | 2012/144165 A | 10/2012 |

* cited by examiner

WIRING STRUCTURE: Cu (330 nm)/Ti (25 nm)
HEAT TREATMENT TEMPERATURE: 450°C (a)

(b)

WIRING STRUCTURE: Cu (330 nm)/Ti (35 nm)
HEAT TREATMENT TEMPERATURE: 450°C (a)

(b)

WIRING STRUCTURE: Cu (330 nm)/Ti (50 nm)
HEAT TREATMENT TEMPERATURE: 450°C (a)

(b)

WIRING STRUCTURE: Cu (280 nm)/Ti (35 nm)
HEAT TREATMENT TEMPERATURE: 350°C (a)

(b)

SEMICONDUCTOR DEVICE AND METHOD FOR MANUFACTURING THE SAME

TECHNICAL FIELD

The present invention relates to a semiconductor device formed by using an oxide semiconductor and to a method for manufacturing the same.

BACKGROUND ART

An active matrix substrate used for a liquid crystal display device and the like is provided with a switching element, e.g., a thin film transistor (hereafter referred to as a "TFT"), on a pixel basis. To date, a TFT including an amorphous silicon film as an active layer (hereafter referred to as an "amorphous silicon TFT") and a TFT including a polycrystalline silicon film as an active layer (hereafter referred to as a "polycrystalline silicon TFT") have been widely used for such a switching element.

In recent years, it has been proposed to use an oxide semiconductor, instead of an amorphous silicon or a polycrystalline silicon semiconductor, as the material for forming the active layer of the TFT. Such a TFT is called an "oxide semiconductor TFT". An oxide semiconductor has higher mobility than amorphous silicon. Consequently, the oxide semiconductor TFT can operate at a higher speed than the amorphous silicon TFT. In addition, the oxide semiconductor film is formed by a simpler process than the process for a polycrystalline silicon film and, therefore, can be applied to a device that is required to have a large area.

Regarding the semiconductor device provided with the oxide semiconductor TFT, if a layer, e.g., a copper (Cu) layer or an aluminum (Al) layer, having low electrical resistance is used for a source and drain electrode, the contact resistance between the Cu layer or Al layer and the oxide semiconductor layer serving as the active layer may increase, and there is a likelihood that predetermined TFT characteristics are not obtained. In order to address this problem, formation of a Ti film between the Al layer or Cu layer and the oxide semiconductor layer has been disclosed (for example, PTLs 1 and 2).

Meanwhile, in a TFT having a bottom gate structure, when a Cu layer or an Al layer is used for a gate electrode, a metal layer, e.g., a Ti layer, may be formed between the Cu layer or the Al layer and a glass substrate so as to enhance the adhesiveness between the two (for example, PTL 2).

CITATION LIST

Patent Literature

PTL 1: Japanese Unexamined Patent Application Publication No. 2010-123923
PTL 2: International Publication No. 2012/144165

SUMMARY OF INVENTION

Technical Problem

According to investigations by the present inventors, it was found that when a multilayer electrode or a multilayer wire including a Cu-containing layer (hereafter referred to as a "main layer") and a Ti layer was used in a semiconductor device provided with an oxide semiconductor TFT, there was a concern that the electrical resistance of the main layer would be increased. It is conjectured that this is because of diffusion of Ti into the main layer and the resistance value of the main layer was increased in the production process. Details will be described later.

The present invention was realized in consideration of the above-described circumstances, and the object thereof is to suppress an increase in the electrical resistance of an electrode or a wire having a multilayer structure in a semiconductor device provided with an oxide semiconductor TFT.

Solution to Problem

A semiconductor device according to an embodiment of the present invention is provided with a substrate and a thin film transistor supported by the substrate, wherein the thin film transistor includes an oxide semiconductor layer, a gate electrode, a gate insulating layer disposed between the gate electrode and the oxide semiconductor layer, and a source electrode and a drain electrode that are in contact with the oxide semiconductor layer, at least one electrode of the source electrode, the drain electrode, and the gate electrode has a multilayer structure that includes a first layer containing copper and a second layer containing titanium or molybdenum, the thickness of the first layer is more than the thickness of the second layer, when the source electrode or the drain electrode has the multilayer structure, the second layer is arranged on the oxide semiconductor layer side of the first layer so as to be in contact with the surface of the oxide semiconductor layer, when the gate electrode has the multilayer structure, the second layer is arranged on the substrate side of the first layer, and the thickness of the second layer is 15 nm or more and 25 nm or less.

In an embodiment, the ratio of the thickness of the first layer to the thickness of the second layer is 9 or more and 25 or less.

In an embodiment, the ratio of the thickness of the first layer to the thickness of the second layer is 13 or more and 25 or less.

In an embodiment, the second layer is in contact with the first layer.

The second layer may contain titanium.

The first layer may be a copper layer and the second layer may be a titanium layer.

In an embodiment, the ratio of metal titanium in the thickness direction of the first layer and the second layer has a peak in the second layer and the value of the peak is 70% or more and 90% or less.

The value of the peak may be 70% or more and 80% or less.

In an embodiment, the thickness of a region, in which the ratio of metal titanium is 20% or more, up to the interface between the first layer and the second layer is 5.5 nm or less in the first layer side region of the peak.

In an embodiment, the oxide semiconductor layer contains an In—Ga—Zn—O-based semiconductor.

In an embodiment, the oxide semiconductor layer includes a crystalline portion.

In an embodiment, the thin film transistor has a channel-etch structure.

A semiconductor device according to as embodiment of the present invention includes the steps of (A) forming a gate electrode on a substrate, (B) forming a gate insulating layer that covers the gate electrode, (C) producing a thin film transistor by forming, on the gate insulating layer, an oxide semiconductor layer and a source electrode and a drain electrode that are in contact with the oxide semiconductor layer, and (D) forming an insulating layer so as to cover the thin film transistor, wherein the step (A) includes the steps of forming a lower layer that contains titanium or molybdenum and has a thickness of 15 nm or more and 25 nm or less, and forming, on the lower layer, a main layer that contains copper so as to produce the gate electrode having a multilayer structure that includes the lower layer and the main layer, and heat treatment is further performed at a temperature of 350° C. or higher and lower than 500° C. after the step (A).

A semiconductor device according to another embodiment of the present invention includes the steps of (a) forming, on a substrate, a thin film transistor that includes an oxide semiconductor layer, a gate electrode, a gate insulating layer disposed between the gate electrode and the oxide semiconductor layer, and a source electrode and a drain electrode that are in contact with the oxide semiconductor layer, and (b) forming an insulating layer so as to cover the thin film transistor, wherein at least one electrode of the source electrode and the drain electrode has a multilayer structure that includes a first layer containing copper and a second layer containing titanium or molybdenum, the second layer is arranged on the oxide semiconductor layer side of the first layer so as to be in contact with the surface of the oxide semiconductor layer, the thickness of the second layer is 15 nm or more and 25 nm or less, and heat treatment is further performed at a temperature of 350° C. or higher and lower than 500° C. after the at least one electrode is formed.

The heat treatment may be performed at a temperature of 400° C. or higher and lower than 500° C.

In an embodiment, the oxide semiconductor layer contains an In—Ga—Zn—O-based semiconductor.

In an embodiment, the oxide semiconductor layer includes a crystalline portion.

In an embodiment, the thin film transistor has a channel-etch structure.

Advantageous Effects of Invention

According to an embodiment of the present invention, a semiconductor device capable of suppressing an increase in the electrical resistance of an electrode or a wire having a multilayer structure can be provided.

DESCRIPTION OF EMBODIMENTS

As described above, in the semiconductor device provided with the oxide semiconductor TFT, the multilayer electrode or the multilayer wire (hereafter genetically referred to as the "multilayer wire") including the main layer that contains Cu and the Ti layer may be used as the source and drain electrode, the source wire, the gate electrode, or the gate wire.

According to investigations by the present inventors, it was found that in an oxide semiconductor TFT having the above-described multilayer electrode or the multilayer wire in the related art, if a heat treatment process for any purpose was performed after the multilayer wire was formed, there was a concern of diffusion of Ti into the main layer. Examples of such a heat treatment process include oxidation treatment (for example, 250° C. or higher and 450° C. or lower) so as to reduce oxygen deficiency of the oxide semiconductor layer. As a result, the purity of the main layer may be reduced and the resistance may increase. It was also found that an increase in the resistance of the multilayer wire was particularly considerable when Cu was used for the main layer.

Further, the present inventors examined the relationship between the temperature of the heat treatment and the rate of increase in the resistivity of the multilayer wire. As a result, it was found that the rate of increase in the resistance value changed in accordance with the temperature of the heat treatment. Here, the "heat treatment temperature" refers to the maximum heat temperature that occurred during the production process (process maximum temperature).

The results of investigations by the present inventors will be described below in more detail. Initially, a change in the resistivity of the multilayer wire due to the heat treatment was examined. Here, a Cu/Ti multilayer wire composed of a Ti layer having a thickness of 35 nm and a Cu layer having a thickness of 150 nm, 280 nm, or 330 nm was subjected to heat treatment at a temperature of 300° C. to 500° C., and the resistivity of the multilayer wire was measured.

Figure 4:
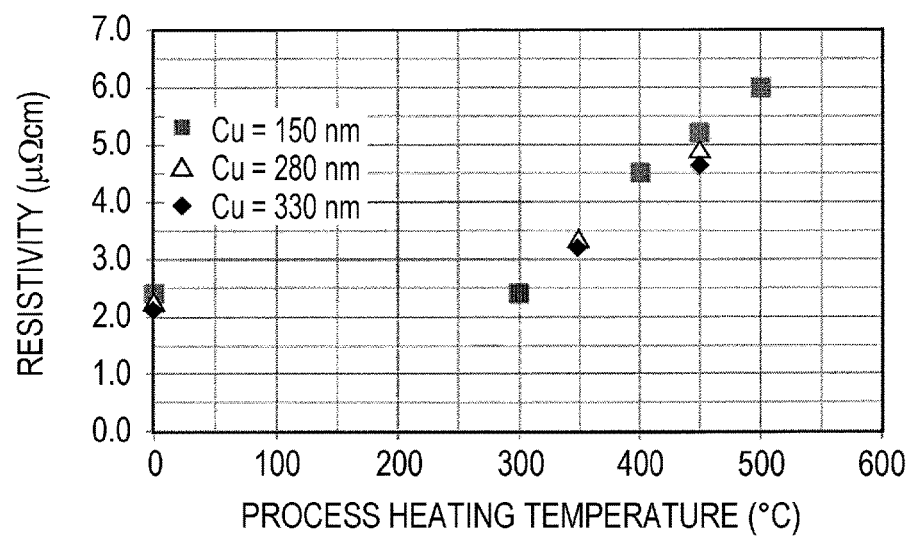
FIG. 4 is a diagram showing examples of the relationship between the heat treatment temperature and the resistivity of a Cu/Ti multilayer wire.

FIG. 4 is a diagram showing examples of the relationship between the heat treatment temperature and the resistivity (sheet resistance) of the multilayer wire. The value of the resistivity at a heat treatment temperature of 0° C. shown in FIG. 4 is a resistivity value of the multilayer wire before being subjected to the heat treatment. As is clear from this result, the resistance value of the multilayer wire increases as the heat treatment temperature increases. Therefore, in order to suppress an increase in the wiring resistance, setting the heat treatment temperature at a low level is considered. However, the heat treatment temperature is determined in accordance with the device characteristics, and in many cases, it is difficult to change the heat treatment temperature in consideration of the wiring resistance.

Figure 5:
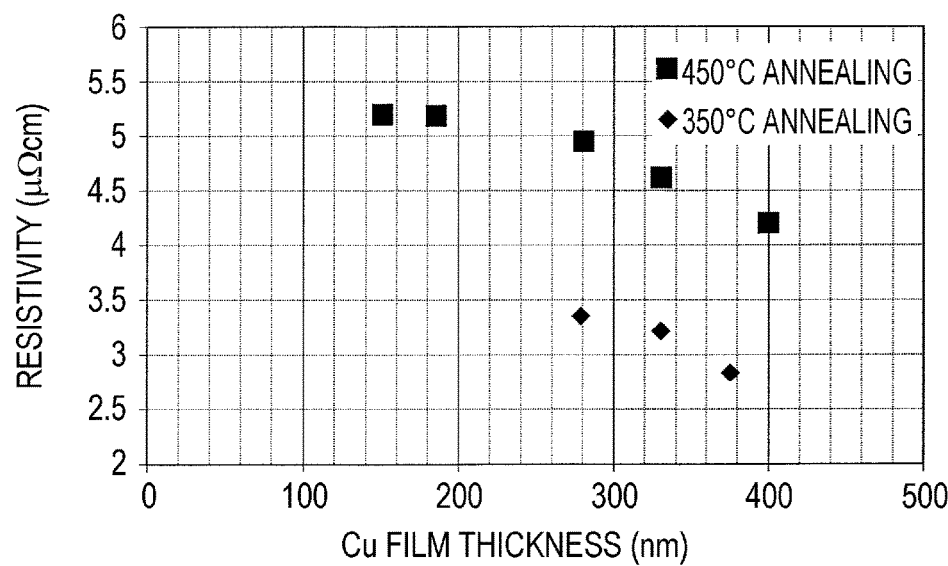
FIG. 5 is a diagram showing examples of the relationship between the thickness of the Cu/Ti multilayer wire and the resistivity after heat treatment.

Even when the heat treatment is performed at a high temperature, for example, increasing the thickness of the main layer in order to suppress an increase in the resistance of the multilayer wire is considered. FIG. 5 is a diagram showing examples of the results of examination of the relationship between the thickness of the Cu layer and the resistivity of the multilayer wire after the heat treatment. Here, the thickness of the Ti layer was kept constant at 35 nm. Meanwhile, the heat treatment temperature was set to be 350° C. or 450° C. As shown in FIG. 5, it was ascertained that the resistivity of the multilayer wire was reduced as the thickness of the Cu layer was increased regardless of the heat treatment temperature. If the thickness of the Cu layer is increased, the wiring resistance can be reduced. However, the production efficiency may be reduced and the production cost may increase.

Then, the present inventors noted the thickness of the Ti layer and examined the relationships between the resistivity of the multilayer wire and the thickness of the Ti layer and between the TFT defective rate and the thickness of the Ti layer.

Figure 6:
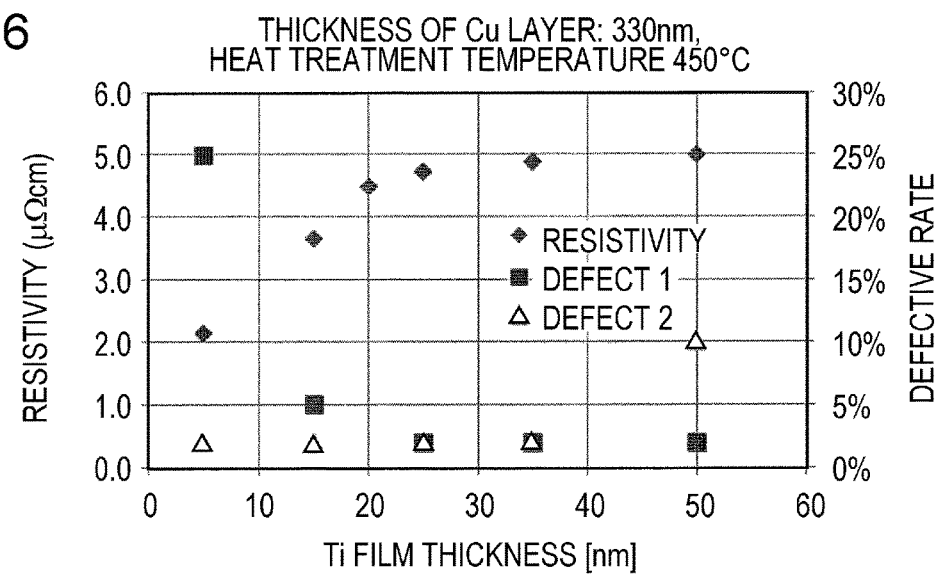
FIG. 6 is a diagram showing examples of the relationships between the resistivity of the Cu/Ti multilayer wire and the thickness of the Ti layer and between the TFT defective rate and the thickness of the Ti layer after heat treatment.
Figure 7:
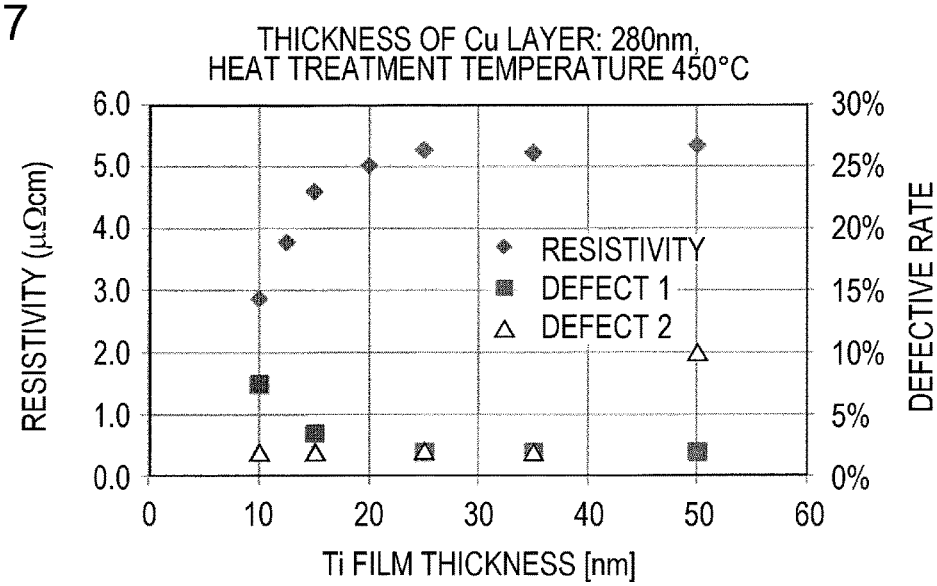
FIG. 7 is a diagram showing examples of the relationships between the resistivity of the Cu/Ti multilayer wire and the thickness of the Ti layer and between the TFT defective rate and the thickness of the Ti layer after heat treatment.

FIG. 6 is a diagram showing examples of the relationships between the resistivity of the multilayer wire and the thickness of the Ti layer and between the TFT defective rate and the thickness of the Ti layer after heat treatment, when the thickness of the Cu layer was set to be 330 nm and the heat treatment was performed at a temperature of 450° C. FIG. 7 is a diagram showing examples of the relationships between the resistivity of the multilayer wire and the thickness of the Ti layer and between the TFT defective rate and the thickness of the Ti layer after heat treatment, when the thickness of the Cu layer was set to be 280 nm and the heat treatment was performed at a temperature of 450° C. In FIG. 6 and FIG. 7, "defect 1" refers to a defect related to the adhesiveness or the contact characteristics. Defect 1 includes defects in adhesiveness between a glass substrate and the multilayer wire, which occur when a gate electrode or a gate wire is formed by using the multilayer wire, and TFT characteristic defects resulting from an increase in the contact resistance, which occurs when a source and drain electrode or a source wire is formed by using the multilayer wire. Meanwhile, "defect 2" refers to an etching residue defect caused by residual Ti when the multilayer wire is etched.

As indicated by examples shown in FIG. 6 and FIG. 7, when the thickness of the Ti layer is 25 nm or less, the resistivity increases as the thickness of the Ti layer increases. When the thickness of the Ti layer is more than 25 nm, the value of the resistivity is substantially constant. Therefore, it is clear that an increase in the resistivity of the multilayer wire can be suppressed by setting the thickness of the Ti layer to be 25 nm or less. Meanwhile, it is clear that the defective rate of defect 1 is reduced to a low level when the thickness of the layer is large but sharply increases when the thickness of the Ti layer is less than 15 nm. Therefore, it is understood that if the thickness of the Ti layer is excessively small (less than 15 nm), an effect of interposing the Ti layer is not sufficiently exerted, predetermined TFT characteristics are not sufficiently provided, and reliability may be reduced.

Also, it is clear that the defective rate of defect 2 due to etching residue increases when the thickness of the Ti layer is 50 nm or more.

From these results, the present inventors found that the yield of the TFT could be ensured while an increase in the resistance of the multilayer wire was suppressed by setting the thickness of the Ti layer to be 15 nm or more and 25 nm or less, and the present invention was realized.

According to an embodiment of the present invention, the wiring resistance can be reduced without increasing the thickness of the Cu layer by controlling the thickness of the Ti layer. In addition, even when the heat treatment temperature is increased (for example, 350° C. or higher, and preferably 400° C. or higher), an increase in the resistance of the multilayer wire can be suppressed. Therefore, an oxide semiconductor layer can be subjected to oxidation treatment at a higher temperature and, thereby, the TFT characteristics can be further stabilized.

First Embodiment

A first embodiment of a semiconductor device according to the present invention will be described below with reference to the drawings. The semiconductor device according to the present embodiment is provided with an oxide semiconductor TFT. In this regard, the semiconductor device according to the present embodiment has only to be provided with the oxide semiconductor TFT and widely includes active matrix substrates, various display devices, electronic equipment, and the like.

Figure 1:
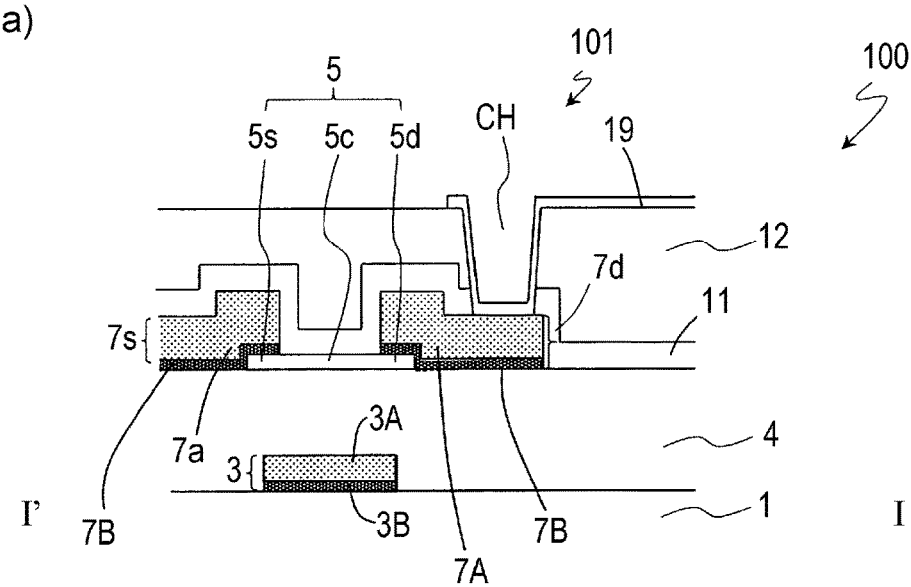
FIGS. 1 (a) and (b) are a schematic sectional view and a schematic plan view, respectively, of a semiconductor device (active matrix substrate) 100 according to a first embodiment.
Figure 1:
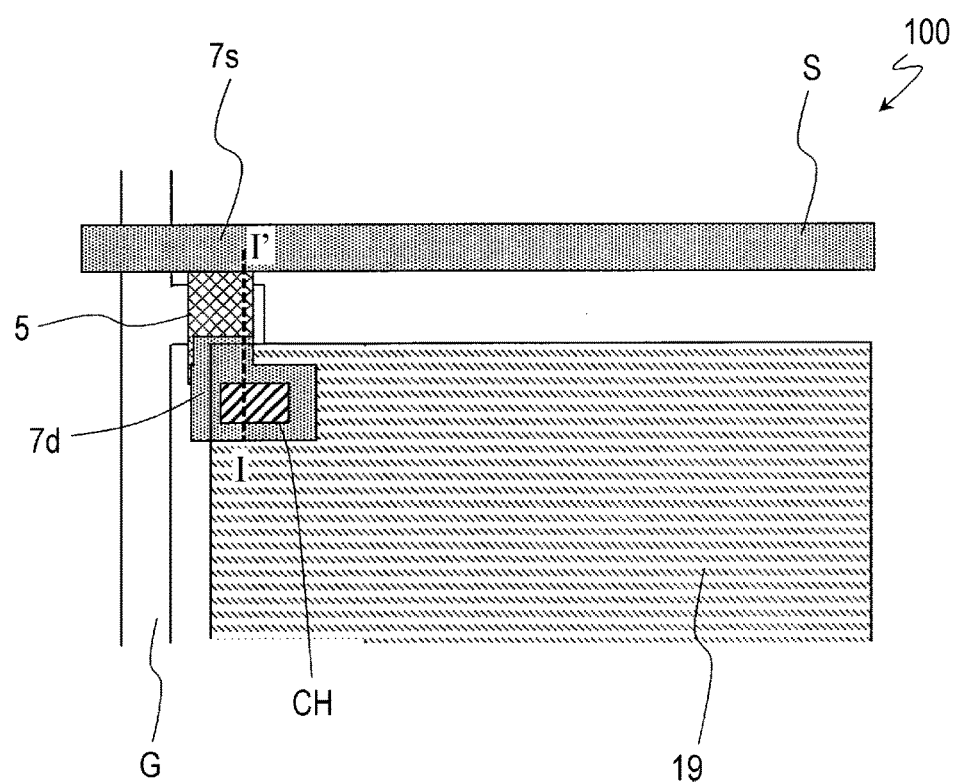

FIG. 1 (a) is a schematic sectional view of an example of a semiconductor device 100 according to the present embodiment. FIG. 1 (b) is a schematic plan view of an example of part of the semiconductor device 100.

The semiconductor device 100 includes an oxide semiconductor TFT 101, insulating layers 11 and 12 that cover the oxide semiconductor TFT 101, and a transparent conductive layer 19.

The oxide semiconductor TFT 101 is, for example, a channel-etch type TFT. The oxide semiconductor TFT 101 includes a gate electrode 3 supported by a substrate 1, a gate insulating layer 4 that covers the gate electrode 3, an oxide semiconductor layer 5 arranged so as to overlap the gate electrode 3 with the gate insulating layer 4 interposed therebetween, a source electrode 7s, and a drain electrode 7d. The oxide semiconductor layer 5 has a channel region 5c and, in addition, a source contact region 5s and a drain contact region 5d which are located on both sides of the channel region. The source electrode 7s is disposed in contact with the source contact region 5s, and the drain electrode 7d is disposed in contact with the drain contact region 5d. In the present embodiment, the source electrode 7s and the drain electrode 7d may be composed of the same multilayer film.

In the present embodiment, each of the source electrode 7s and the drain electrode 7d (hereafter also generically referred to as "source drain electrode 7") and the gate electrode 3 has a multilayer structure.

The source drain electrode 7 has a multilayer structure that includes a main layer 7A containing Cu and a contact layer 7B containing Ti or Mo. The contact layer 7B is arranged between the main layer 7A and the oxide semiconductor layer 5 so as to be in contact with the upper surface of the oxide semiconductor layer 5. The main layer 7A may be in contact with the upper surface of the contact layer 7B. The main layer 7A may be a Cu layer, an alloy layer containing Cu, or the like. The contact layer 7B may be a Ti layer, a Mo layer, an alloy layer containing Ti or Mo, or the like. In addition, the source drain electrode 7 may have a multilayer structure of three or more layers including the main layer 7A and the contact layer 7B.

The thickness of the contact layer 7B is 15 nm or more and 25 nm or less. There is no particular limitation regarding the thickness of the main layer 7A, and the thickness may be more than the thickness of the contact layer 7B. The thickness of the main layer 7A may be, for example, 100 nm or more and 500 nm or less.

The gate electrode 3 may have the same multilayer structure as the multilayer structure of the source drain electrode 7. In the present embodiment, the gate electrode 3 has a multilayer structure that includes a main layer 3A containing Cu and a lower layer 3B containing Ti or Mo. The lower layer 3B is arranged between the main layer 3A and the substrate 1. The lower layer 3B may be in contact with the surface of the substrate 1. The main layer 3A may be a Cu layer, an alloy layer including Cu, or the like. The lower layer 3B may be a Ti layer, a Mo layer, an alloy layer containing Ti or Mo, or the like. In addition, the gate electrode 3 may have a multilayer structure of three or more layers, in which the main layer 3A and the lower layer 3B are included. The thickness of the lower layer 3B is 15 nm or more and 25 nm or less. The thickness of the main layer 3A may be more than the thickness of the lower layer 3B and may be, for example, 100 nm or more and 500 nm or less.

In the present example, the main layers 7A and 3A are the Cu layer, and the contact layer 7B and the lower layer 3B are the Ti layer. The Cu layer has only to be a layer containing Cu as a primary component and may contain impurities. The content of Cu in the main layer 7A may be, for example, 90% or more. Preferably, the main layer 7A is a pure Cu layer (Cu content: for example, 99.99% or more). Likewise, the Ti layer has only to be a layer containing Ti as a primary component and may contain impurities. The content of Ti in the contact layer 7B may be, for example, 90% or more.

A first insulating layer 11 is disposed so as to cover the oxide semiconductor TFT 101. In the example shown in the drawing, the first insulating layer 11 is disposed in contact with the upper surface of the source and drain electrode 7. In this regard, the first insulating layer 11 may be arranged in contact with the channel region 5c of the oxide semiconductor layer 5. A second insulating layer 12 may be disposed on the first insulating layer 11. The first insulating layer 11 may be an inorganic insulating layer, e.g., a $SiO_2$ layer, and the second insulating layer 12 may be an organic insulating layer. A contact hole CH that reaches the surface of the drain electrode 7d (here, the surface of the main layer 7A) is formed in the first insulating layer 11 and the second insulating layer 12.

The transparent conductive layer 19 is disposed on the second insulating layer 12 and in the contact hole CH. The transparent conductive layer 19 is in direct contact with the drain electrode 7d (here, the main layer 7A) in the contact hole CH.

The semiconductor device 100 may be applied to, for example, an active matrix substrate of a display device. The semiconductor device 100 may be applied to, for example, a display device of a vertical electric field drive system, e.g., a display device having vertical alignment mode. The active matrix substrate has a display region (active region) that contributes to display and a peripheral region (picture-frame region) that is located outside the display region.

As shown in FIG. 1 (*b*), a plurality of gate wires and a plurality of source wires S are disposed in the display region, and each of regions surrounded by these wires serves as a "pixel". A plurality of pixels are arranged in the matrix. The transparent conductive layer 19 is disposed in each pixel. The transparent conductive layer 19 is isolated on a pixel basis and functions as a pixel electrode. In each pixel, the oxide semiconductor TFT 101 is disposed in the vicinity of each of the points of the intersection of the plurality of source wires S and the plurality of gate wires G. The drain electrode 7d of the oxide semiconductor TFT 101 is electrically connected to the corresponding transparent conductive layer (pixel electrode) 19.

The source wire S is electrically connected to the source electrode 7s. The source wire S may be composed of the same multilayer conductive film as the source electrode 7s. In the present example, the source electrode 7s is part of the source wire S and is formed integrally with the source wire S. Likewise, the gate wire G is electrically connected to the gate electrode 3. The gate wire G may be composed of the same multilayer conductive film as the gate electrode 3. The gate wire G may be formed integrally with the gate electrode 3.

According to the present embodiment, the following effects are obtained.

In the present embodiment, the source drain electrode 7 and the source wire S have a multilayer structure that includes the main layer 7A and the contact layer (Ti layer or Mo layer) 7B. The contact layer 7B is located between the main layer 7A and the oxide semiconductor layer 5 and the thickness of the contact layer 7B is 15 nm or more and 25 nm or less. The thickness of the contact layer 7B is 15 nm or more and, therefore, the contact resistance between the source drain electrode 7 and the oxide semiconductor layer 5 can be reduced and predetermined TFT characteristics can be realized, as described above with reference to FIG. 6 and FIG. 7. Meanwhile, the thickness of the contact layer 7B is 25 nm or less and, therefore, an increase in the resistance value of the main layer 7A due to thermal diffusion of Ti or Mo, which is contained in the contact layer 7B, into the main layer 7A can be suppressed in the heat treatment step. Consequently, degradation of the TFT characteristics (increase in on-resistance and the like) due to an increase in the resistance of the source drain electrode 7 and the source wire can be suppressed.

In addition, in the present embodiment, the gate electrode 3 and the gate wire C have a multilayer structure that includes the main layer 3A and the lower layer (Ti layer or Mo layer) 3B. The lower layer 3B is located between the main layer 3A and the substrate 1 and the thickness of the lower layer 3B is 15 nm or more and 25 nm or less. The thickness of the lower layer 3B is 15 nm or more and, therefore, the adhesiveness between the gate electrode 3 and the substrate 1 can be improved and the reliability of the oxide semiconductor TFT 101 can be enhanced, as described above with reference to FIG. 6 and FIG. 7. Meanwhile, the thickness of the lower layer 3B is 25 nm or less and, therefore, an increase in the resistance value of the main layer 3A due to thermal diffusion of Ti or Mo, which is contained in the lower layer 3B, into the main layer 3A can be suppressed in the heat treatment step.

In the example shown in FIG. 1, each of the source drain electrode 7, the gate electrode 3, the source wire 3, and the gate wire G has the multilayer structure that includes the main layer and the contact layer or includes the main layer and the lower layer. However, it is not necessary that all of these electrodes and wires have the multilayer structure. The semiconductor device according to the present embodiment has an effect of suppressing an increase in the resistance value when at least one electrode of the source electrode 7s, the drain electrode 7d, and the gate electrode 3 has the above-described multilayer structure.

In this regard, in order to more effectively suppress the increase in the wire resistance, the thicknesses of the contact layer 7B and the lower layer 3B in the multilayer structure may be, for example, 15 nm or more and less than 25 nm, and preferably 15 nm or more and 20 nm or less. Meanwhile, in order to more reliably realize the predetermined TFT characteristics, the thickness of the contact layer 7B may be, for example, more than 20 nm and 25 nm or less. Also, in order to more effectively improve the reliability, the thickness of the lower layer 3B may be, for example, more than 20 nm and 25 nm or less.

In the oxide semiconductor TFT 101 shown in FIG. 1, the gate electrode 3 is arranged on the substrate 1 side of the oxide semiconductor layer 5 (bottom gate structure), but the gate electrode 3 may be arranged above the oxide semiconductor layer 5 (top gate structure). Meanwhile, the oxide semiconductor TFT 101 may have a top contact structure in which the source drain electrode 7 is in contact with the upper surface of the oxide semiconductor layer 5 or a bottom contact structure in which the source drain electrode 7 is in contact with the lower surface of the oxide semiconductor layer 5. When the source drain electrode 7 has the multilayer structure, the contact layer 7B has only to be arranged on the oxide semiconductor layer 5 side of the main layer 7A. For example, in the bottom contact structure, the contact layer 7B is arranged under the main layer 7A. Further, the oxide semiconductor TFT 101 may have a channel-etch structure or an etch-stop structure including an etch stop that covers the channel region. As shown in FIG. 1, in a "channel-etch type TFT", no etch-stop layer is disposed on the channel region 5c, and the lower surface of the channel-side side end portion of the source drain electrode 7 is arranged in contact with the upper surface of the oxide semiconductor layer 5. The channel-etch type TFT is formed by, for example, forming a conductive film for the source drain electrode on the oxide semiconductor layer 5 and performing source drain isolation. In a source-drain isolation step, the surface portion of the channel region may be etched. Meanwhile, in a TFT (etch-stop type TFT) in which an etch-stop layer is disposed on the channel region 5c, the lower surface of the channel-side end portion of the source-drain electrode 7 is located on, for example, the etch-stop layer. The etch-stop type TFT formed by, for example, forming an etch-stop layer that covers a portion serving as the channel region 5c in the oxide semiconductor layer 5, forming a conductive film for the source-drain electrode on the oxide semiconductor layer 5 and the etch-stop layer, and performing source drain isolation.

When the gate electrode 3 or the gate wire has the multilayer structure, it is preferable that the oxide semiconductor TFT 101 has the bottom gate structure. Consequently, the resistance of the electrode or the wire can be reduced while the adhesiveness between the substrate 1 and the gate electrode 3 is ensured.

Here, the oxide semiconductor layer 5 used in the present embodiment will be described. An oxide semiconductor contained in the oxide semiconductor layer 5 may be an amorphous oxide semiconductor or a crystalline oxide semiconductor having a crystalline portion. Examples of crystalline oxide semiconductors include a polycrystalline oxide semiconductor, a microcrystalline oxide semiconductor, and a crystalline oxide semiconductor in which the c-axis is aligned in the direction substantially perpendicular to the layer surface.

The oxide semiconductor layer 5 may have a multilayer structure of two or more layers. When the oxide semiconductor layer 5 has the multilayer structure, the oxide semiconductor layer 5 may include an amorphous oxide semiconductor layer and a crystalline oxide semiconductor layer. Alternatively, the oxide semiconductor layer 5 may include a plurality of crystalline oxide semiconductor layers having different crystal structures. Alternatively, the oxide semiconductor layer 5 may include a plurality of amorphous oxide semiconductor layers. When the oxide semiconductor layer 5 has a two-layer structure including an upper layer and a lower layer, it is preferable that the energy gap of the oxide semiconductor contained in the upper layer be larger than the energy gap of the oxide semiconductor contained in the lower layer. However, when a difference in the energy gap between these layers is relatively small, the energy gap of the oxide semiconductor of the lower layer may be larger than the energy gap of the oxide semiconductor of the upper layer.

The materials, the structures, the film formation methods, the configurations of the oxide semiconductor layers having the multilayer structure, and the like of the amorphous oxide semiconductor and each of the above-described crystalline oxide semiconductors are described in, for example, Japanese Unexamined Patent Application Publication No, 2014-007399. The entire contents disclosed in Japanese Unexamined Patent Application Publication No. 2014-007399 are incorporated into the present specification for reference.

The oxide semiconductor layer 5 may contain, for example, at least one metal element of In, Ga, and Zn. In the present embodiment, the oxide semiconductor layer 5 contains, for example, an In—Ga—Zn—O-based semiconductor (for example, indium gallium zinc oxide). Here, the In—Ga—Zn—O-based semiconductor is a ternary oxide of In (indium), Ga (gallium), and Zn (zinc), the proportions (composition ratio) of In, Ga, and Zn are not specifically limited, and In:Ga:Zn=2:2:1, In:Ga:Zn=1:1:1, In:Ga:Zn=1:1:2, and the like are included, for example. Such an oxide semiconductor layer 5 may be composed of an oxide semiconductor film containing an In—Ga—Zn—O-based semiconductor. In this regard, the channel-etch type TFT including an active layer that contains an oxide semiconductor, e.g., an In—Ga—Zn—O-based semiconductor, may be referred to as a "CE-OS-TFT".

The In—Ga—Zn—O-based on semiconductor may be amorphous or crystalline. A crystalline In—Ga—Zn—O-based semiconductor in which the c-axis is aligned in the direction substantially perpendicular to the layer surface is preferable as the In—Ga—Zn—O-based semiconductor.

In this regard, the crystal structure of the crystalline In—Ga—Zn—O-based semiconductor is disclosed in, for example, Japanese Unexamined Patent Application Publication No. 2014-007399 described above, Japanese Unexamined Patent Application Publication No. 2012-134475, and Japanese Unexamined Patent Application Publication No. 2014-209727. The entire contents disclosed in Japanese Unexamined Patent Application Publication No. 2012-134475 and Japanese Unexamined Patent Application Publication No. 2014-209727 are incorporated into the present specification for reference. A TFT including the In—Ga—Zn—O-based semiconductor has high mobility (more than 20 times the mobility of a-SiTFT) and a low leakage current (less than one-hundredth of the leakage current of a-SiTFT) and, therefore, is suitable for use as a drive TFT (for example, TFT included in a drive circuit disposed around the display region, which includes a plurality of pixels, and on the same substrate as the substrate of the display region) and a pixel TFT (TFT disposed in a pixel).

The oxide semiconductor layer 5 may contain another oxide semiconductor instead of the In—Ga—Zn—O-based semiconductor. For example, an In—Sn—Zn—O-based semiconductor (for example, $In_2O_3$—$SnO_2$—ZnO; InSn-ZnO) may be included. The In—Sn—Zn—O-based semiconductor is a ternary oxide of In (indium), Sn (tin), and Zn (zinc). Alternatively, the oxide semiconductor layer 5 may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, and the like.

<Modified Example of Semiconductor Device>

The semiconductor device according to the present embodiment is not limited to the semiconductor device 100 shown in FIG. 1. For example, another transparent conduction that functions as a common electrode may be further included on the transparent conductive layer 19 that functions as a pixel electrode or between the interlayer insulating layer 11 and the transparent conductive layer 19. Consequently, a semiconductor device including two transparent electrode layers is produced. Such a semiconductor device can be applied to, for example, a FFS (fringe field switching) mode liquid crystal display device.

Figure 2:
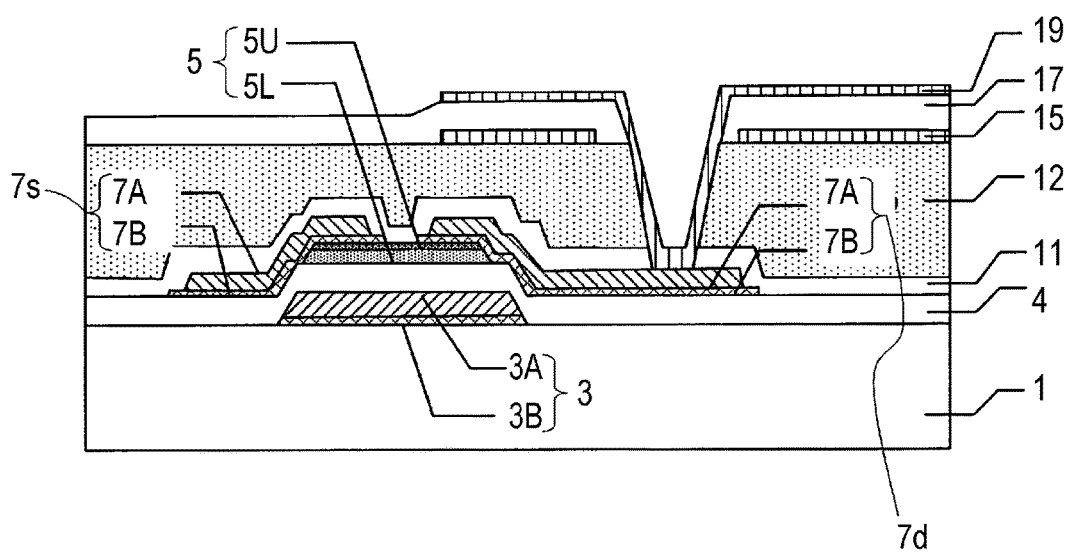
FIG. 2 is a schematic sectional view of another semiconductor device (active matrix substrate) 200 according to the first embodiment.

FIG. 2 is a schematic sectional view of another semiconductor device (active matrix substrate) 200 according to the present embodiment. In FIG. 2, the same elements as in FIG. 1 are indicated by the same reference numerals as those set forth above and explanations thereof will not be provided.

In the semiconductor device 200, a common electrode 15 is disposed between the interlayer insulating layer 11 and the transparent conductive layer (pixel electrode) 19 so as to be opposed to the pixel electrode 19. A third insulating layer 17 is disposed between the common electrode 15 and the pixel electrode 19. Meanwhile, the oxide semiconductor layer 5 has a multilayer structure that includes an oxide semiconductor lower layer 5L and an oxide semiconductor upper layer 5U. The materials, the composition ratios, or the crystal states of the oxide semiconductor lower layer 5L and the oxide semiconductor upper layer 5U may be different from each other. The material, the composition ratio, and the crystal state at each layer are not specifically limited, and may be the material, the composition ratio, and the crystal state described above as examples. In the present example, In—Ga—Zn—O-based semiconductors having different composition ratios are used as the oxide semiconductor lower layer 5L and the oxide semiconductor upper layer 5U. The other structures nay be the same as the structures of the semiconductor device 100 shown in FIG. 1.

A common signal (COM signal) is applied to the common electrode 15. The common electrode 15 has an opening portion on a pixel basis, and a contact portion of the pixel electrode 19 and the drain electrode 7d of the oxide semiconductor TFT 101 may be formed in the opening portion. The common electrode 15 may be disposed over the substantially entire display region (excluding the above-described opening portion).

<Method for Manufacturing Semiconductor Device>

Next, a method for manufacturing the semiconductor device according to the present embodiment will be described on the basis of, as an example, a method for producing the semiconductor device 200 shown in FIG. 2 with reference to FIG. 3 (a) to (g).

Figure 3:
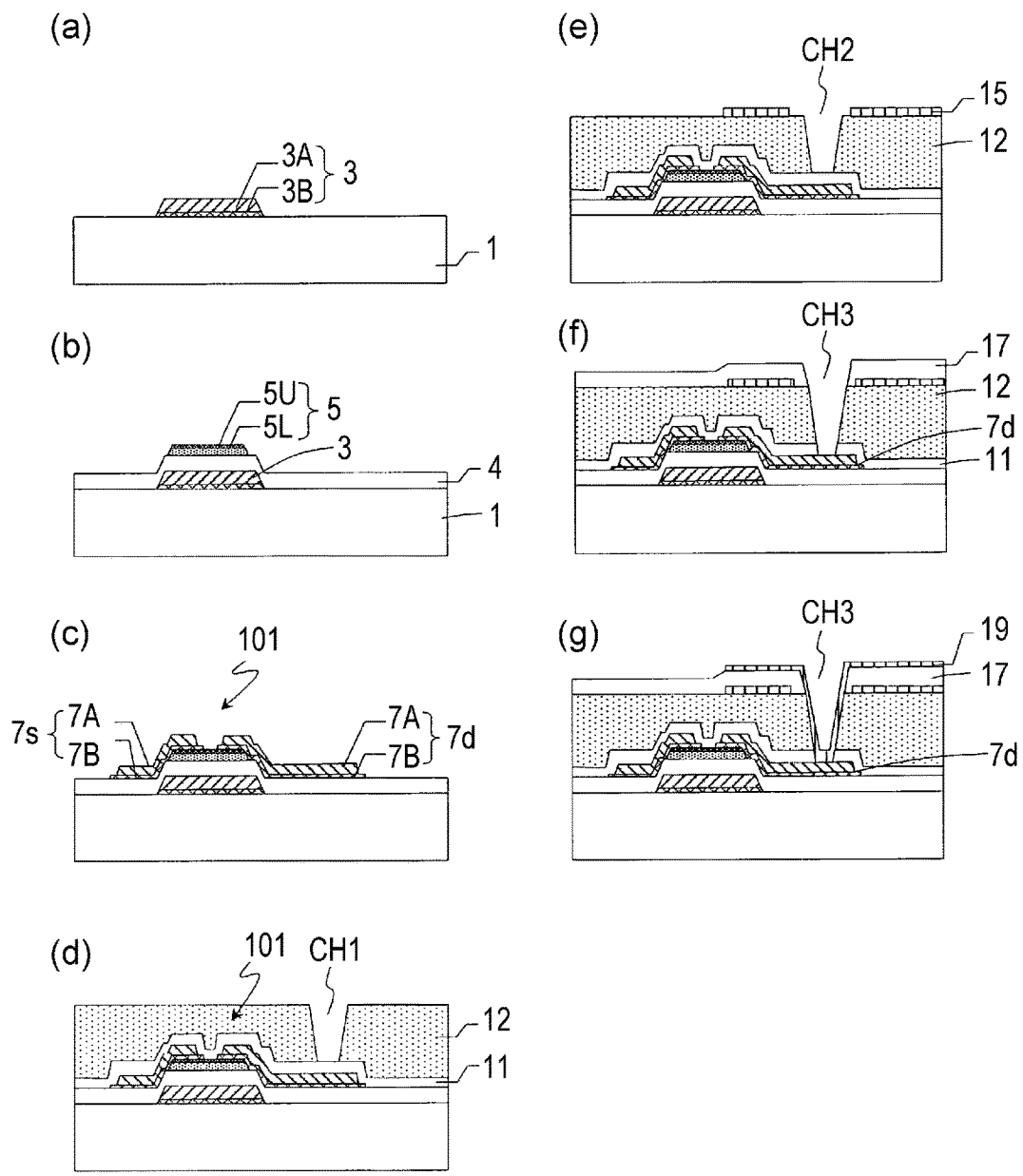
FIG. 3 (a) to (g) are step sectional views illustrating a method for manufacturing the semiconductor device 200.

As shown in FIG. 3 (a), the gate electrode 3 and the gate wire (not shown in the drawing) are formed on the substrate 1.

Regarding the substrate 1, for example, a glass substrate, a silicon substrate, a plastic substrate (resin substrate) having thermal resistance, or the like can be used.

The gate electrode 3 and the gate wire can be produced by forming a metal film for a gate wire on the substrate 1 by a sputtering method or the like and patterning the metal film. Here, for example, a Ti film having a thickness of 15 nm or more and 25 nm or less and a Cu film having a larger thickness than the Ti film are formed in this order as the metal film for a gate wire. The thickness of the Cu film is, for example, 100 nm or more and 500 nm, and preferably 200 nm or more and 400 nm or less. The patterning of the metal film for a gate wire (multilayer film) is performed by forming a resist mask (not shown in the drawing) by a known photolithography and, thereafter, removing a portion of the metal film for a gate wire that is not covered with the resist mask by, for example, wet etching. After the patterning, the resist mask is removed. In this manner, the gate electrode 3 and the gate wire having the Cu/Ti multilayer structure are produced.

Subsequently, as shown in FIG. 3 (b), a gate insulating layer 4 is formed so as to cover the gate electrode 3 and the gate wire. Thereafter, the oxide semiconductor layer 5 is formed on the gate insulating layer 4.

The gate insulating layer 4 may be formed by a CVD method or the like. Regarding the gate insulating layer 4, a silicon oxide (SiOx) layer, a silicon nitride (SiNx) layer, a silicon oxynitride (SiOxNy; x>y) layer, a silicon nitride oxide (SiNxOy; x>y) layer, and the like can be appropriately used. The gate insulating layer 4 may have the multilayer structure. For example, a silicon nitride layer, a silicon nitride oxide layer, or the like may be formed on the substrate side (lower layer) for the purpose of preventing diffusion of impurities and the like from the substrate 1 and a silicon oxide layer, a silicon oxynitride layer, or the like may be formed as a layer thereon (upper layer) for the purpose of ensuring the insulating property. In this regard, when an oxygen-containing layer (for example, a layer of an oxide, e.g., $SiO_2$) is used as an uppermost layer (that is, a layer in contact with the oxide semiconductor layer) of the gate insulating layer 4, oxygen deficiency of the oxide semiconductor layer can be effectively reduced because oxygen deficiency can be recovered by oxygen contained in the oxide layer if oxygen deficiency occurs in the oxide semiconductor layer. Here, a SiNx layer having a thickness of 200 nm or more and 500 nm or less and a $SiO_2$ layer having a thickness of 25 nm or more and 100 nm or less, which serve as the gate insulating layer 4, are stacked in this order on the substrate 1.

The oxide semiconductor layer 5 can be formed by forming an oxide semiconductor film (thickness of 30 to 100 nm) for the purpose of forming the oxide semiconductor lower layer 5L and an oxide semiconductor film (thickness of 10 to 80 nm) for the purpose of forming the oxide semiconductor upper layer 5U sequentially by a sputtering method and performing patterning. The oxide semiconductor films having compositions different from each other can be formed by changing the material of the target in the sputtering. In this regard, the patterning can be performed by photolithography, wet etching, and resist peeling washing.

Here, the oxide semiconductor lower layer 5L, is formed as a layer having a relatively small energy gap and high mobility. When the oxide semiconductor layer 5 is composed of an InGaZnO-based semiconductor layer, the oxide semiconductor lower layer 5L may have a composition ratio of In, Ga, and Zn of, for example, 1:1:1. The composition of the oxide semiconductor lower layer 5L may be, for example, the same as the composition of an oxide semiconductor layer in the oxide semiconductor TFT, in the related art, that is composed of a single oxide semiconductor layer. In this regard, the In concentration (atomic percent) in the oxide semiconductor lower layer 5L may be higher than or equal to the Ga concentration (atomic percent).

Meanwhile, the oxide semiconductor upper layer 5U is formed as a layer having a relatively large energy gap. When the oxide semiconductor layer 5 is composed of an InGaZnO-based semiconductor layer, the oxide semiconductor upper layer 5U may have a composition in which the Ga concentration is higher than the Ga concentration in the lower layer semiconductor layer and may have a composition in which the In concentration is lower than the In concentration. In the oxide semiconductor lower layer 5L. In addition, in the oxide semiconductor upper layer 5U, the In concentration may be lower than the Ga concentration.

Then, as shown in FIG. (c), the source electrode 7s, the drain electrode 7d, and the source wire are formed so as to produce the oxide semiconductor TFT 101.

Specifically, a metal film for a source wire is formed on the oxide semiconductor layer 5 and the gate insulating layer 4 initially. The metal film for a source wire is formed by, for example, a sputtering method. Here, a multilayer film, in which a Ti film having a thickness of 15 nm or more and 25 nm or less and a Cu film having a thickness of, for example, 100 nm or more and 500 nm or less are stacked in this order from the oxide semiconductor layer 5 side, is formed as the metal film for a source wire.

Thereafter, the resulting metal film for a source wire is subjected to patterning. Here, a resist mask is formed on the metal film for a source wire by photolithography, and the Cu film is patterned by wet Fetching. For example, an etchant containing hydrogen peroxide ($H_2O_2$) or the like may be used as an etching liquid. Subsequently, the same resist mask is used, and the Ti film is patterned by dry etching. In this manner, the source electrode 7s, the drain electrode 7d, and a source wire, which have a Cu/Ti multilayer structure, are produced. Then, the resist mask is removed. In the oxide semiconductor layer 5, a portion in contact with the source electrode 7s serves as a source contact region, and a portion in contact with the drain electrode 7d serves as a drain contact region.

There is no particular limitation regarding the method for etching the metal film for a source wire. However, if the Ti film is patterned by wet etching, the entire oxide semiconductor layer 5 may be removed. Therefore, it is preferable that the etching is performed by dry etching. In this regard, if dry etching of the Ti film is performed, the vicinity of the surface of the oxide semiconductor layer 5 may be etched (over etching). In the present embodiment, the thickness of the Ti film is 25 nm or less and, therefore, an etching residue of Ti can be reduced while the amount of over etching is reduced.

When the above-described two-stage etching including the wet etching and the dry etching is performed, at the end surfaces of the resulting source electrode 7s and the drain electrode 7d, the end surface of the wet-etched Cu layer may be located inside the end surface of the dry-etched Ti layer. That is, the end surface of the Cu layer may be located on the upper surface of the Ti layer.

Next, as shown in FIG. 3 (d), a first insulating layer 11 and a second insulating layer 12 are formed so as to cover the oxide semiconductor TFT 101.

Regarding the first insulating layer 11, an inorganic insulating film (passivation film), e.g., a silicon oxide (SiOx) film, a silicon nitride (SiNx) film, a silicon oxynitride (SiOxNy; x>y) film, or a silicon nitride oxide (SiNxOy; x>y) film, can be used. The first insulating layer 11 may be a multilayer film. Here, a SiOx layer having a thickness of, for example, 100 nm or more and 400 nm or less and a SiNx layer having a thickness of 20 nm or more and 200 nm or less, which serve as the first insulating layer 11, are formed in this order by, for example, a CVD method.

Subsequently, the entire substrate is subjected to heat treatment (annealing). According to the investigations by the present inventors, it was found that the TFT characteristics could be more stabilized by increasing the temperature of the heat treatment. The temperature of the heat treatment may be, for example, 350° C. or higher, or 400° C. or higher. According to the present embodiment, even when the heat treatment is performed at such a high temperature, an increase in the wiring resistance due to diffusion of Ti can be suppressed. On the other hand, if the heat treatment temperature is excessively high, it may be difficult to sufficiently suppress an increase in the wiring resistance due to thermal diffusion of Ti. Therefore, the heat treatment temperature is set to be, for example, lower than 500° C.

Then, the second insulating layer 12 is formed on the first insulating layer 11. The second insulating layer 12 is produced by, for example, forming an organic insulating film and performing patterning. The second insulating layer 12 may contain a photosensitive resin material. The second insulating layer 12 has an opening portion that exposes the first insulating layer 11 in a portion located in the second insulating layer 12 and above the drain electrode 7d. Here, a positive type photosensitive resin film having a thickness of, for example, 2,000 nm is used as the second insulating layer 12.

Thereafter, the second insulating layer 12 is used as an etching mask, and the first insulating layer 11 is removed by etching. Consequently, an opening portion CH1 that exposes the surface of the drain electrode 7d is formed.

Subsequently, as shown in FIG. 3 (e), the common electrode 15 is formed on the second insulating layer 12. Specifically, a transparent conductive film (not shown in the drawing) is formed by, for example, a sputtering method. Regarding the transparent conductive film, for example, an ITO (indium.tin oxide) film (thickness: 50 nm or more and 200 nm or less), an In—Zn—O-based oxide (indium.zinc oxide) film, and a ZnO film (zinc oxide film) can be used. Then, the transparent conductive film is patterned so as to produce the common electrode 15 having an opening portion CH2 that exposes the opening portion CH1.

Thereafter, as shown in FIG. 3 (f), the third insulating layer 17 is formed on the second insulating 12 and the common electrode 15. Here, a SiNx layer having a thickness of 100 nm or more and 400 nm or less is formed as the third insulating layer 17 by the CVD method. Subsequently, the third insulating layer 17, the second insulating layer 12, and the first insulating layer 11 were patterned so as to form an opening portion CH3 that reaches the drain electrode 7d.

Then, as shown in FIG. 3 (g), a transparent conductive film is formed on the third insulating layer 17 and in the opening portion CH3, and patterning is performed so as to produce the transparent conductive layer 19 that serves as a pixel electrode. Regarding the transparent conductive film, for example, an ITO (indium.tin oxide) film (thickness: 50 nm or more and 200 nm or less), an In—Zn—O-based oxide (indium.zinc oxide) film, and a ZnO film (zinc oxide film) can be used. In this manner, the semiconductor device 200 can be produced.

In the above-described method, a multilayer wire that includes the Cu layer and the Ti layer is formed as the gate electrode 3 and the source drain electrode 7. However, only one of them may be a multilayer wire and the other may be a single-layer wire. In this regard, the gate electrode 3 and the source drain electrode 7 may have a multilayer structure of three or more layers. For example, a three-layer wire, in which Ti layers are arranged such that a Cu layer is interposed therebetween, may be adopted.

In the above-described method, the first insulating layer 11 is formed and, thereafter, the heat treatment (oxidation treatment) for oxidizing the oxide semiconductor layer 5 is performed before the second insulating layer 12 is formed. However, the oxidation treatment step may be performed after the oxide semiconductor film is formed and before the oxide semiconductor film is patterned. Alternatively, the oxidation treatment step may be performed after the oxide semiconductor layer 5 is formed by patterning the oxide semiconductor film and before the metal film for a source wire is formed. Alternatively, the oxidation treatment step can also be performed after the source and drain electrode 7 is formed and before the first insulating layer 11 is formed. Regarding the oxidation treatment, plasma treatment by using $N_2O$ gas, plasma treatment by using $O_2$ gas, ozone treatment, and the like may be performed.

For example, when an oxide semiconductor TFT having a channel-etch structure is produced, the oxide semiconductor layer and the source drain electrode 7 may be formed and, thereafter, the oxide semiconductor layer 5 may be subjected to the oxidation treatment, e.g., $N_2O$ plasma treatment before the first insulating layer 11 is formed. The oxygen concentration of the surface of the oxide semiconductor layer 5 is increased by this treatment, and an oxygen-excess region is formed. As a result, when the first insulating layer 11 is formed by, for example, plasma CVD, an occurrence of oxygen deficiency of the oxide semiconductor layer 5 and reduction in the resistance of the oxide semiconductor layer surface due to hydrogen contained in the film formation gas can be suppressed.

Meanwhile, in the above-described method, the heat treatment is performed for the purpose of oxidizing the oxide semiconductor layer 5, but the purpose of the heat treatment is not limited to this. In the present embodiment, in a step after at least one multilayer wire is formed, heat treatment has only to be performed at least once for any purpose. The heat treatment may be performed a plurality of times at heat treatment temperatures different from each other. When the heat treatment is performed a plurality of times, the "heat treatment temperature" in the present specification refers to the highest temperature among the heat treatment temperatures (process maximum temperature).

In the present embodiment, the Cu layer is used as the main layer 7A of the source drain electrode 7 and the main layer 3A of the gate electrode 3. However, the same effects are obtained when a Cu alloy layer is used. Meanwhile, the Ti layer is used as the contact layer 7B of the source drain electrode 7 and the lower layer 3B of the gate electrode 3. However, the same effects are also obtained when an alloy layer containing Ti, a Mo layer, or an alloy layer containing Mo is used.

<Profile of Each Element in Depth Direction of Multilayer Wire>

The present inventors examined the relationship of the structure of the multilayer wire and the heat treatment temperature with the profile of each element in the depth direction of the multilayer wire after the heat treatment. The method and the results thereof will be described.

Initially, a Ti film, a Cu film, a SiN film were formed in this order on a glass substrate, and heat treatment was performed so as to form measurement samples No. 1 to No. 4. The Ti film corresponded to the contact layer of the gate electrode, the Cu film corresponded to the main layer of the gate electrode, and the SiN film corresponded to the first insulating layer.

The thickness of the Cu film, the thickness of the Ti film, and the heat treatment temperature of each sample are shown in Table 1. In this regard, the thickness of the SiN film of each sample was set to be 325 nm.

TABLE 1

| Sample No. | Thickness of Cu film | Thickness Ti film | Heat treatment temperature |
|---|---|---|---|
| 1 | 330 nm | 25 nm | 450° C. |
| 2 | 330 nm | 35 nm | 450° C. |
| 3 | 330 nm | 50 nm | 450° C. |
| 4 | 280 nm | 35 nm | 350° C. |

Subsequently, the profile of each element in the depth direction of each sample was measured by Auger electron spectroscopy. In the analysis, the bonding state of Ti was also examined. In the following description, Ti having an oxidic bonding state (Ti constituting a metal oxide $TIO_2$) is expressed as "Ti (oxide)", Ti having a metallic bonding state (metal Ti) is expressed as "Ti (pure)", and Ti including every bonding state is expressed as "Ti (total)".

Each (a) of FIG. 8 to FIG. 11 is a diagram showing the results of analyzing the abundance ratio of each element in the depth direction of measurement samples No. 1 to No. 4. Each (b) of FIG. 8 to FIG. 11 is a magnified diagram showing the profile of an interfacial portion between the Cu film and the Ti film in the profile shown in each (a) of FIG. 8 to FIG. 11, respectively. In FIG. 8 to FIG. 11, the horizontal axis indicates the etching time and the vertical axis indicates the abundance ratio of each element. The etching time of the horizontal axis corresponds to the depth from the surface of each sample.

Figure 10:
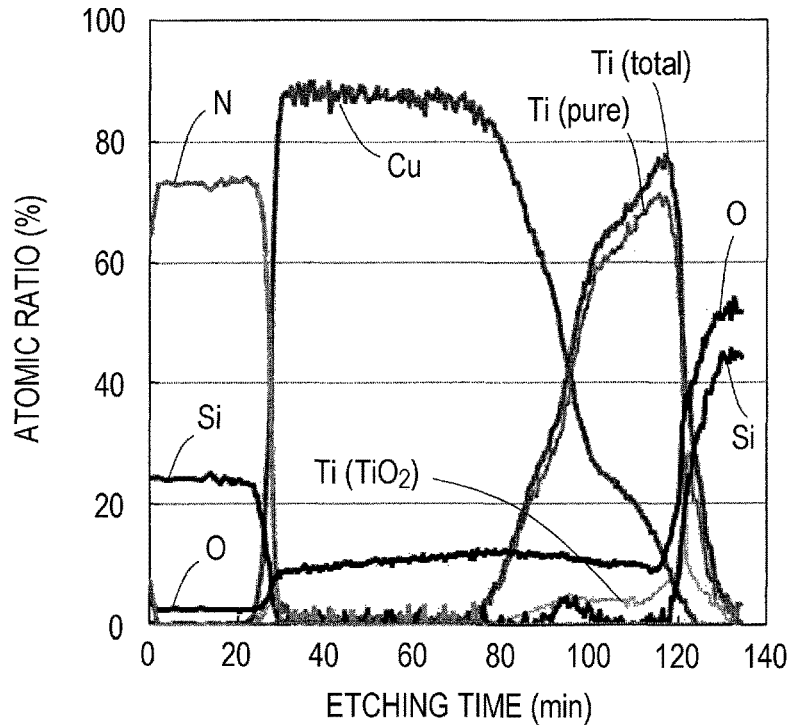
FIG. 10 (a) is a diagram showing the abundance ratio of each element in the depth direction of measurement sample No. 3, and FIG. 10 (b) is a magnified diagram of part of FIG. 10 (a).
Figure 10:
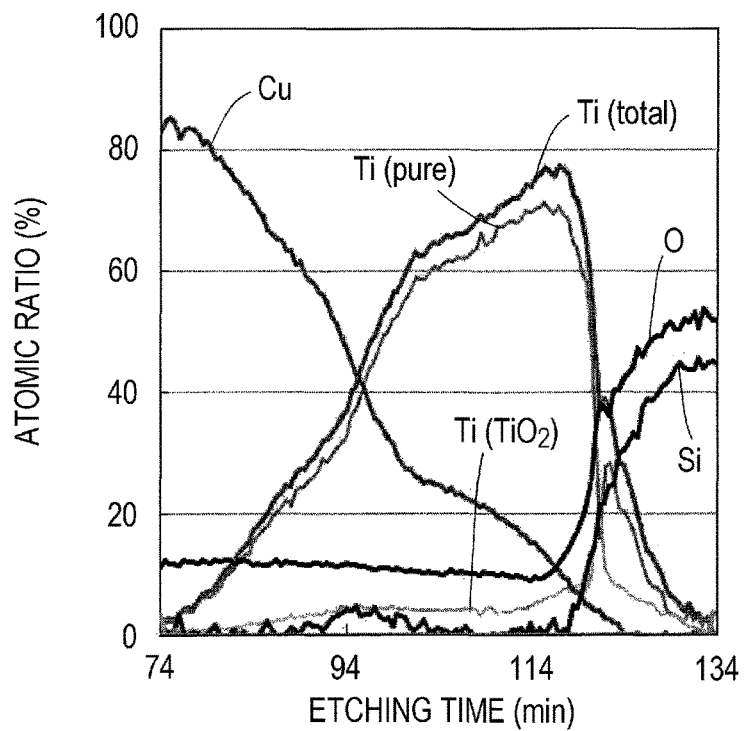
Figure 11:
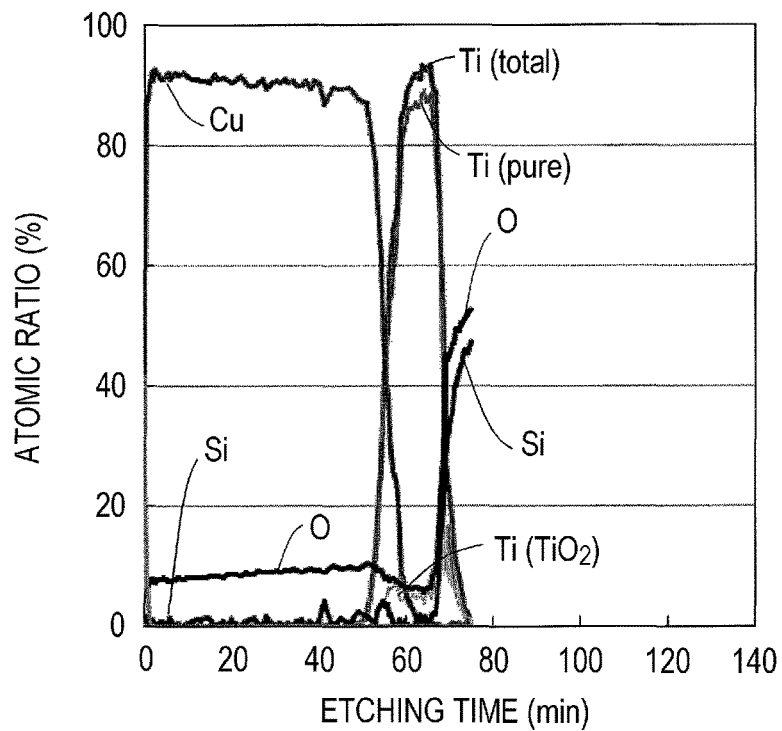
FIG. 11 (a) is a diagram showing the abundance ratio of each element in the depth direction of measurement sample No. 4, and FIG. 11 (b) is a magnified diagram of part of FIG. 11 (a).
Figure 11:
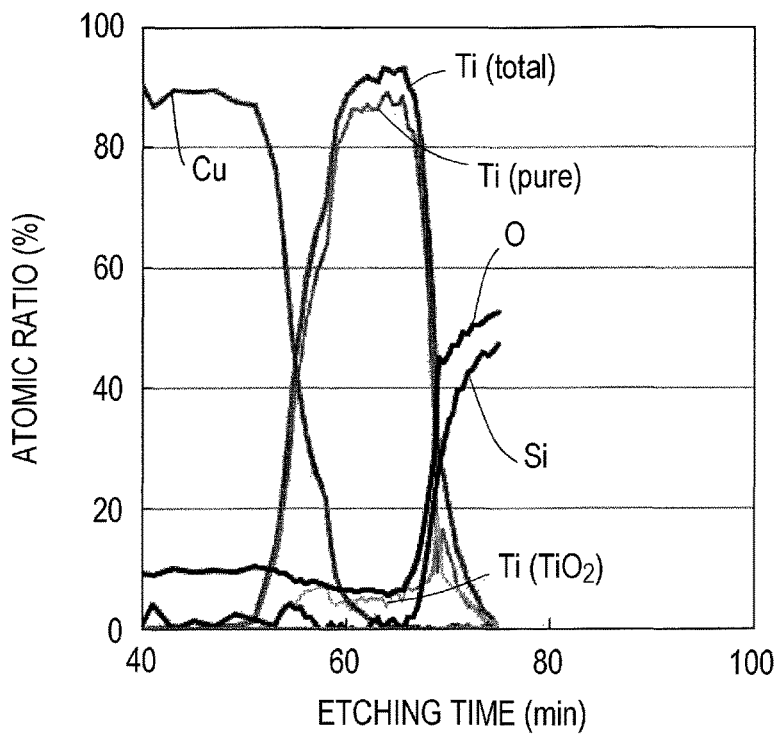

It is clear from these analytical results that, as the heat treatment temperature increases, diffusion of Ti and Cu in the thickness direction increases at the interface between the Ti film and the Cu film. For example, when the heat treatment temperature is 350° C., the peak value of the ratio of Ti (total) in the Ti film is about 90% (FIG. 11). However, when the heat treatment temperature is 450° C., the peak value of the ratio of Ti (total) is about 80% (FIG. 8 to FIG. 10) and, therefore, the amount of diffusion of Ti into the Cu film increases.

Figure 8:
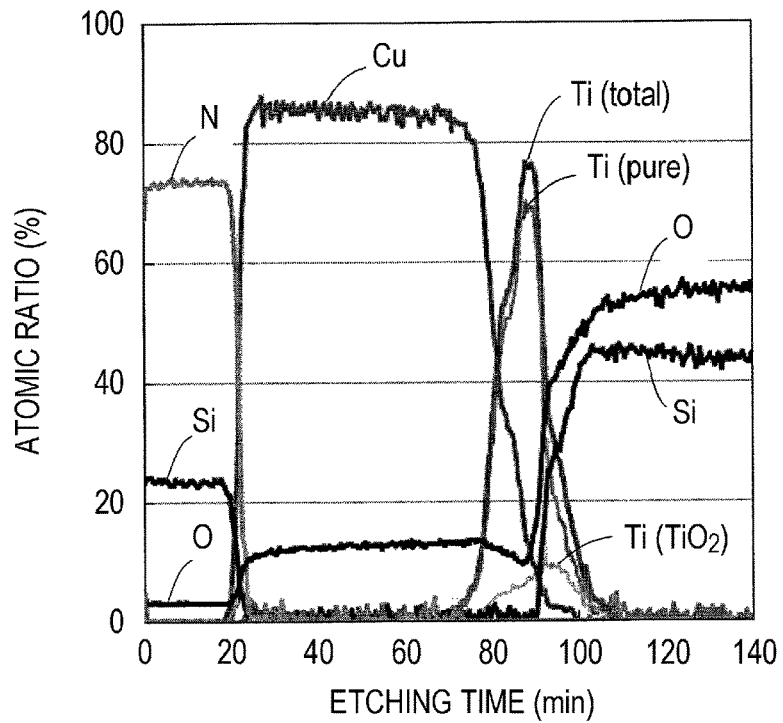
FIG. 8 (a) is a diagram showing the abundance ratio of each element in the depth direction of measurement sample No. 1, and FIG. 8 (b) is a magnified diagram of part of FIG. 8 (a).
Figure 8:
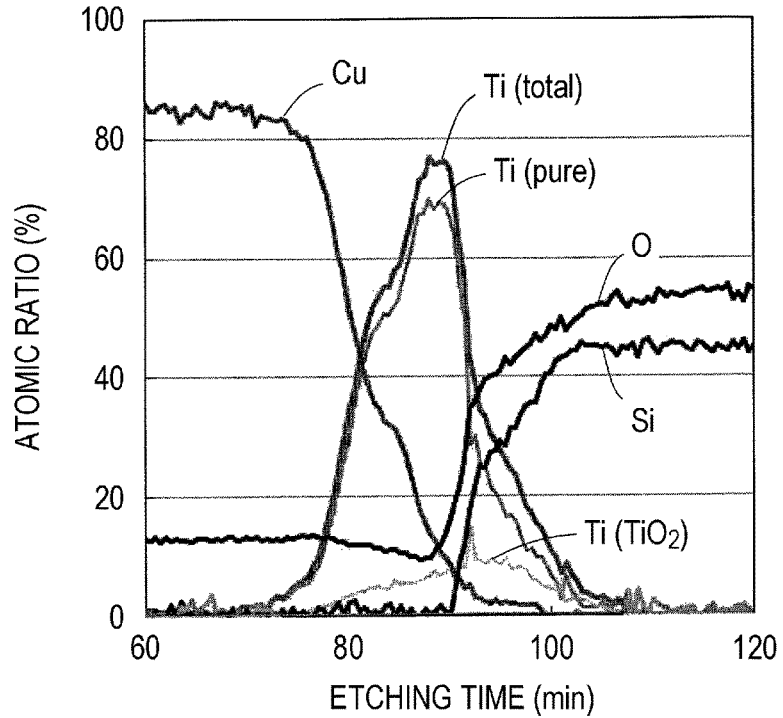
Figure 9:
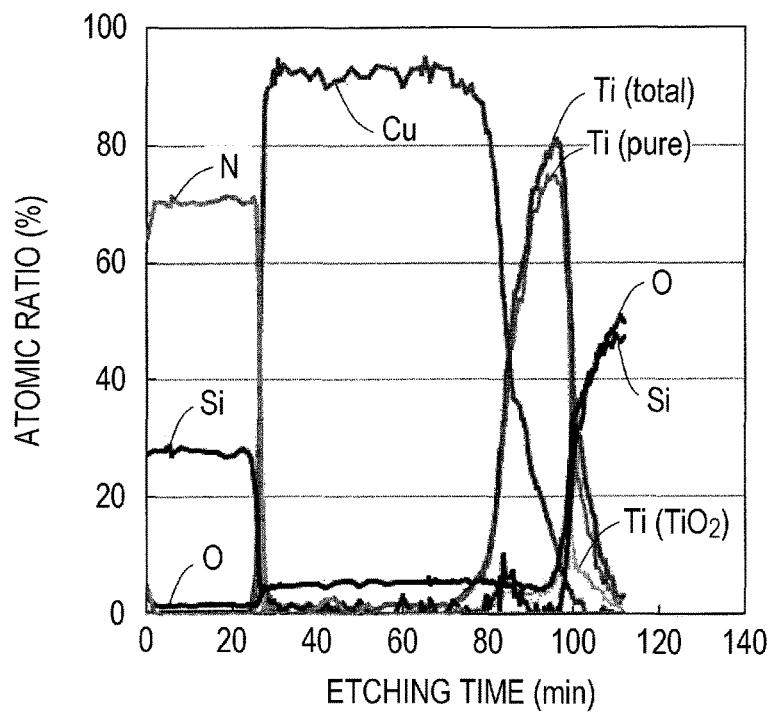
FIG. 9 (a) is a diagram showing the abundance ratio of each element in the depth direction of measurement sample No. 2, and FIG. 9 (b) is a magnified diagram of part of FIG. 9 (a).
Figure 9:
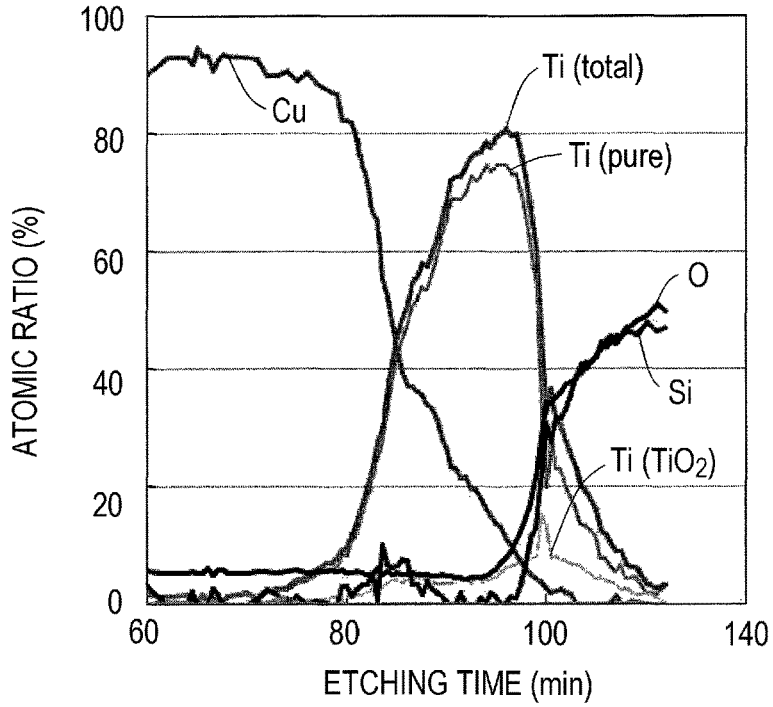

The profile of Ti (pure) that is metal Ti shows the same tendency. It is clear that the ratio of Ti (pure) has a peak in the Ti film and the peak value decreases as the heat treatment temperature increases. When the heat treatment temperature is 350° C., the peak value of the ratio of Ti (pure) is about 90% (FIG. 11), and when the heat treatment temperature is 450° C., the peak value of the ratio of Ti (pure) is about 70% (FIG. 8 to FIG. 10). Therefore, in the present example, it is clear that when the heat treatment is performed at a temperature of 350° C. or higher and 450° C. or lower, the peak value of the ratio of Ti (pure) is 70% or more and 90% or less. Although not shown in the drawing, it is conjectured that when the heat treatment is performed at a temperature of 400° C. or higher and 450° C. or lower, the peak value of the ratio of Ti (pure) may be, for example, 70% or more and 80% or less.

Meanwhile, the amount of diffusion of Ti into the Cu film increases as the thickness of the Ti film increases. In addition, as the thickness of the Ti film increases, the ratio of Ti more moderately decreases from a region in which the peak is present toward the Cu film. Consequently, in the Cu film side from the interface between the Ti film and the Cu film (or the depth of the peak of Ti), the thickness of a region (metal Ti diffusion region) m, in which Ti (total) or Ti (pure) is, for example, 20% or more and less than Cu detection interface, increases as the thickness, which is converted from the Ti etching rate during AES analysis, of the Ti film increases. The thickness of the above-described region m is about 5.5 nm in sample No. 1, about 6.4 nm in sample No. 2, and about 18.4 nm in sample No. 3. As described above, it is conjectured that when the thickness of the Ti film increases, Ti diffuses into wider range of the Cu film and, as a result, the thickness of the region m increases so as to increase the electrical resistance of the multilayer wire. An increase in the resistance can be effectively suppressed as the thickness of the above-described region m decreases. Therefore, in the Cu film side region relative to the peak of metal Ti, the thickness up to the interface between the Ti film and the Cu film (or the peak of metal Ti) of a region in which the ratio of metal Ti is 20% or more is preferably, for example, 5.5 nm or less.

In this regard, although not shown in the drawing, when the heat treatment temperature is 350° C., an increase in the wiring resistance can be suppressed likewise while the effect of reducing the contact resistance is maintained by setting the thickness of the Ti film to be 25 nm or less. Also, when the thickness of the Cu film is 280 nm, the same effect is obtained by setting the thickness of the Ti film to be 25 nm or less.

In this regard, the conditions of heat treatment time, the temperature, and the like may be different from the conditions described here as examples. When the heat treatment condition is different, a high yield and a reduction in the wiring resistance can be ensured in combination by decreasing the thickness of the metal Ti diffusion region m in the profile in the depth direction of the multilayer wire.

<Relationship Between Ratio of Thickness of Each Layer of Multilayer Wire and Resistance>

The present inventors investigated the relationship between the ratio ($d_{(Cu)}/d_{(Ti)}$) of the thickness $d_{(Cu)}$ of the Cu layer to the thickness $d_{(Ti)}$ of the Ti layer in the multilayer wire (hereafter referred to as "$d_{(Cu)}/d_{(Ti)}$" and the wiring resistance. The results thereof will be described.

In this regard, the ratio $d_{(Cu)}/d_{(Ti)}$ of thickness in the multilayer wire after the heat treatment is substantially the same as the ratio of thickness in the multilayer wire before the heat treatment (asdepo). Even after Ti in the Ti layer is diffused into the Cu layer due to the heat treatment, it is possible to identify the interface between the Ti layer and the Cu layer by observing the cross-section of the multilayer wire by SEN (scanning electron microscope) so as to determine the thickness of each layer and the $d_{(Cu)}/d_{(Ti)}$.

Figure 12:
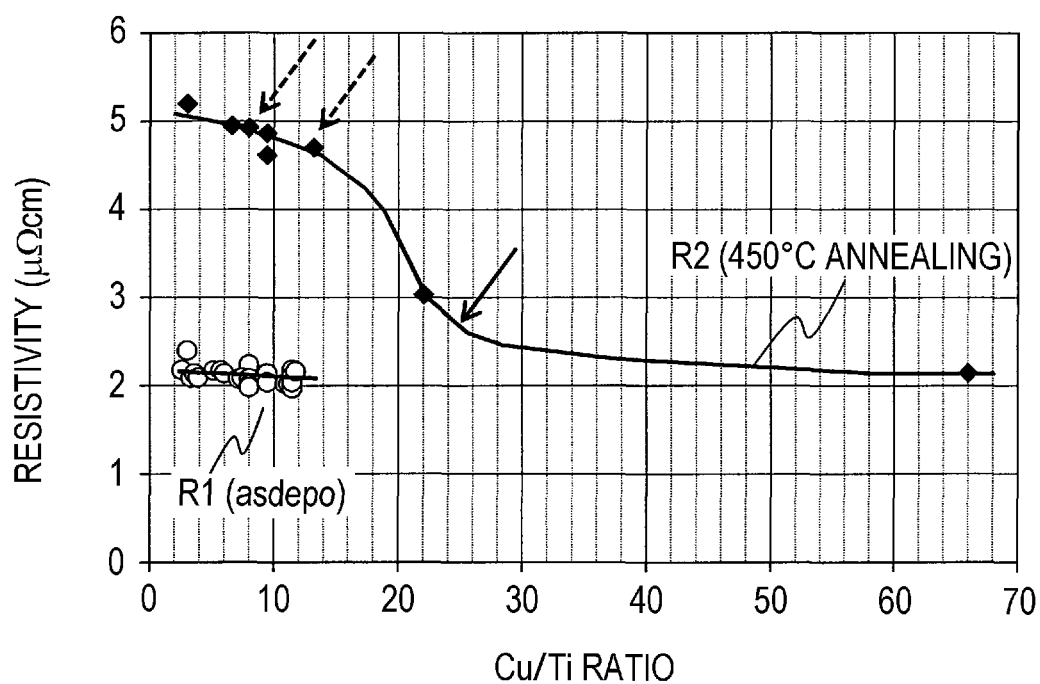
FIG. 12 is a diagram showing examples of the relationship between the ratio ($d_{(Cu)}/d_{(Ti)}$) of the thickness $d_{(Cu)}$ the Cu layer to the thickness $d_{(Ti)}$ of the Ti layer in the multilayer wire and the resistivity of the multilayer wire.

FIG. 12 is a diagram showing examples of the relationship between the ratio $d_{(Cu)}/d_{(Ti)}$ of the thickness and the resistivity of the multilayer wire and showing resistivity R1 of the multilayer wire before the heat treatment and resistivity R2 of the multilayer wire after the heat treatment at 450° C. Here, the value of $d_{(Cu)}/d_{(Ti)}$ was changed by changing the thickness of the Ti layer within the range of 5 to 50 nm) and changing the thickness of the Cu layer.

As is clear from this result, when the $d_{(Cu)}/d_{(Ti)}$ is small, the rate of increase of the wiring resistance due to the heat resistance increases. In the present example, when the $d_{(Cu)}/d_{(Ti)}$ is, for example, 9 or more, the effect of suppressing an increase in the wiring resistance can be more reliably obtained. Meanwhile, it is clear that when the $d_{(Cu)}/d_{(Ti)}$ is, for example, 25 or less, defects 1 and defects 2 (refer to FIG. 6 and FIG. 7) can be more reliably reduced while the wiring resistance is reduced.

The $d_{(Cu)}/d_{(Ti)}$ is preferably 13 or more and 25 or less. When the $d_{(Cu)}/d_{(Ti)}$ is 13 or more, a high yield and predetermined wiring resistance R2 are more effectively ensured in combination because an increase in the wiring resistance can be further suppressed.

INDUSTRIAL APPLICABILITY

The present invention can be widely applied to the oxide semiconductor TFT and various semiconductor devices including the oxide semiconductor TFT. For example, the present invention can also be applied to circuit substrates, e.g., an active matrix substrate, display devices, e.g., a liquid crystal display device, an organic electroluminescence (EL) display device, and an inorganic electroluminescence (EL) display device, image capturing devices, e.g., an image sensing device, and various electronic equipment, e.g., an image input device, a fingerprint reading device, and a semiconductor memory.

REFERENCE SIGNS LIST 1 substrate
3 gate electrode
3A main layer
3B lower layer
4 gate insulating layer
5 oxide semiconductor layer
5s source contact region
5d drain contact region
5c channel region
7s source electrode
7d drain electrode
7A main layer
7B contact layer
11 first insulating layer
12 second insulating layer
19 transparent conductive layer
101 oxide semiconductor TFT
100 semiconductor device

The invention claimed is:

1. A method for manufacturing a semiconductor device comprising the steps of:
   (A) forming a gate electrode on a substrate;
   (B) forming a gate insulating layer that covers the gate electrode;
   (C) producing a thin film transistor by forming, on the gate insulating layer, an oxide semiconductor layer and a source electrode and a drain electrode that are in contact with the oxide semiconductor layer; and
   (D) forming an insulating layer so as to cover the thin film transistor,
   wherein the step (A) includes the steps of
      forming a lower layer that contains titanium or molybdenum and has a thickness of 15 nm or more and 25 nm or less, and forming, on the lower layer, a main layer that contains copper so as to produce the gate electrode having a multilayer structure that includes the lower layer and the main layer, and heat treatment is further performed at a temperature of 350° C. or higher and lower than 500° C. after the step (A).

2. A method for manufacturing a semiconductor device comprising the steps of:
(a) forming, on a substrate, a thin film transistor that includes an oxide semiconductor layer, a gate electrode, a gate insulating layer disposed between the gate electrode and the oxide semiconductor layer, and a source electrode and a drain electrode that are in contact with the oxide semiconductor layer; and
(b) forming an insulating layer so as to cover the thin film transistor,
wherein at least one electrode of the source electrode and the drain electrode has a multilayer structure that includes a first layer containing copper and a second layer containing titanium or molybdenum, and the second layer is arranged on the oxide semiconductor layer side of the first layer so as to be in contact with the surface of the oxide semiconductor layer, the thickness of the second layer being 15 nm or more and 25 nm or less, and heat treatment is further performed at a temperature of 350° C. or higher and lower than 500° C. after the at least one electrode is formed.

3. The method for manufacturing a semiconductor device according to claim 1, wherein the heat treatment is performed at a temperature of 400° C. or higher and lower than 500° C.

4. The method for manufacturing a semiconductor device according to claim 1, wherein the oxide semiconductor layer contains an In—Ga—Zn—O-based semiconductor.

5. The method for manufacturing a semiconductor device according to claim 4, wherein the oxide semiconductor layer includes a crystalline portion.

6. The method for manufacturing a semiconductor device according to claim 1, wherein the thin film transistor has a channel-etch structure.

* * * * *